(12) United States Patent
Cheng et al.

(10) Patent No.: US 10,840,349 B2
(45) Date of Patent: Nov. 17, 2020

(54) FORMATION OF AIR GAP SPACERS FOR REDUCING PARASITIC CAPACITANCE

(71) Applicant: INTERNATIONAL BUSINESS MACHINES CORPORATION, Armonk, NY (US)

(72) Inventors: Kangguo Cheng, Schenectady, NY (US); Peng Xu, Santa Clara, CA (US); Choonghyun Lee, Rensselaer, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/738,345

(22) Filed: Jan. 9, 2020

(65) Prior Publication Data

US 2020/0152760 A1  May 14, 2020

Related U.S. Application Data

(62) Division of application No. 16/005,252, filed on Jun. 11, 2018, now Pat. No. 10,608,096.

(51) Int. Cl.
*H01L 29/49* (2006.01)
*H01L 21/768* (2006.01)
(Continued)

(52) U.S. Cl.
CPC ...... *H01L 29/4991* (2013.01); *H01L 21/7682* (2013.01); *H01L 21/76829* (2013.01);
(Continued)

(58) Field of Classification Search
CPC .......... H01L 29/4991; H01L 21/1682; H01L 21/76829; H01L 23/5226; H01L 29/0847; H01L 29/6656
See application file for complete search history.

(56) References Cited

U.S. PATENT DOCUMENTS 5,770,507 A * 6/1998 Chen ............... H01L 29/4933
257/E21.438
5,869,379 A 2/1999 Gardner et al.
(Continued)

OTHER PUBLICATIONS

Kuhn et al., "Considerations for Ultimate CMOS Scaling", IEEE Transactions on Electron Devices. vol. 59, No. 7. Jul. 2012. pp. 1813-1828.
(Continued)

*Primary Examiner* — Earl N Taylor
(74) *Attorney, Agent, or Firm* — Tutunjian & Bitetto, P.C.; Daniel Morris

(57) ABSTRACT

A method is presented for reducing parasitic capacitance. The method includes forming a source region and a drain region within a substrate, forming spacers in direct contact with sidewalls of a sacrificial layer, depositing an inter-layer dielectric (ILD) over the source and drain regions, replacing the sacrificial layer with a gate structure, removing the ILD, and depositing a sacrificial dielectric layer. The method further includes removing portions of the sacrificial dielectric layer to expose top surfaces of the source and drain regions, depositing a conductive material over the exposed top surfaces of the source and drain regions, and removing remaining portions of the sacrificial dielectric layer to form air gap spacers between the gate structure and the source and drain regions.

20 Claims, 9 Drawing Sheets

(51) Int. Cl.
  *H01L 29/66* (2006.01)
  *H01L 23/522* (2006.01)
  *H01L 29/08* (2006.01)

(52) U.S. Cl.
  CPC ...... *H01L 23/5226* (2013.01); *H01L 29/0847* (2013.01); *H01L 29/6656* (2013.01)

(56) References Cited

U.S. PATENT DOCUMENTS

| | | | |
|---|---|---|---|
| 7,329,576 B2 | 2/2008 | Sandhu et al. | |
| 9,070,712 B2 | 6/2015 | Witters | |
| 9,252,233 B2 | 2/2016 | Hsiao et al. | |
| 9,362,355 B1 | 6/2016 | Cheng et al. | |
| 9,608,065 B1* | 3/2017 | Bergendahl | H01L 27/0886 |
| 9,721,897 B1* | 8/2017 | Cheng | H01L 21/02126 |
| 9,735,047 B1* | 8/2017 | Chang | H01L 21/7682 |
| 9,754,940 B2 | 9/2017 | Glass et al. | |
| 9,768,118 B1* | 9/2017 | Li | H01L 23/5283 |
| 9,871,121 B2 | 1/2018 | Xu et al. | |
| 9,911,806 B2 | 3/2018 | Kelly et al. | |
| 2013/0093019 A1 | 4/2013 | Ando et al. | |
| 2013/0299920 A1 | 11/2013 | Yin et al. | |
| 2018/0006128 A1* | 1/2018 | Cheng | H01L 21/823468 |
| 2018/0097059 A1* | 4/2018 | Bi | H01L 29/4991 |
| 2018/0130899 A1* | 5/2018 | Zhang | H01L 29/7851 |
| 2018/0138280 A1 | 5/2018 | Li et al. | |
| 2018/0166319 A1* | 6/2018 | Park | H01L 29/6653 |
| 2018/0166553 A1 | 6/2018 | Lee et al. | |
| 2018/0240883 A1 | 8/2018 | Chanemougame et al. | |
| 2018/0269301 A1* | 9/2018 | Cheng | H01L 29/66795 |
| 2019/0181223 A1* | 6/2019 | Tang | H01L 21/76897 |
| 2019/0198635 A1* | 6/2019 | Zhang | H01L 29/515 |

OTHER PUBLICATIONS

Lee et al., "Oxygen Potential Engineering of Interfacial Layer for Deep Sub-nm EOT High-k Gate Stacks on Ge", 2013 IEEE International Electron Devices Meeting. Dec. 9, 2013. pp. 2-5.

List of IBM Patents or Patent Applications Treated as Related dated Jan. 9, 2020, 2 pages.

Office Action with cited art in corresponding U.S. Appl. No. 16/738,383 dated Jun. 1, 2020.

Final Office Action with cited art in corresponding U.S. Appl. No. 16/738,383 dated Sep. 2, 2020.

* cited by examiner

FORMATION OF AIR GAP SPACERS FOR REDUCING PARASITIC CAPACITANCE

BACKGROUND

Technical Field

The present invention relates generally to semiconductor devices, and more specifically, to forming air gap spacers to reduce parasitic capacitance.

Description of the Related Art

In the current fabrication of an integrated circuit, a dielectric layer is formed as a device isolation structure to cover a substrate and a transistor after completion of the manufacturing of the transistor. A consequence of having multiple layers of conductive structure separated by a dielectric material, however, is the formation of a parasitic capacitor between a transistor gate and a source/drain region. The parasitic capacitance between the conductive material separated by the insulating material in microelectronic devices contributes to effects such as the resistor-capacitor (RC) delay time and a decrease of the device operating speed.

SUMMARY

In accordance with an embodiment, a method is provided for reducing parasitic capacitance. The method includes forming a source region and a drain region within a substrate, forming spacers in direct contact with sidewalls of a sacrificial layer, depositing an inter-layer dielectric (ILD) over the source and drain regions, replacing the sacrificial layer with a gate structure, removing the ILD, depositing a sacrificial dielectric layer, removing portions of the sacrificial dielectric layer to expose top surfaces of the source and drain regions, depositing a conductive material over the exposed top surfaces of the source and drain regions, and removing remaining portions of the sacrificial dielectric layer to form air gap spacers between the gate structure and the source and drain regions.

In accordance with another embodiment, a method is provided for reducing parasitic capacitance. The method includes forming a source region and a drain region within a substrate, forming spacers in direct contact with sidewalls of a sacrificial layer, depositing an inter-layer dielectric (ILD) over the source and drain regions, replacing the sacrificial layer with a gate structure, removing the ILD and the spacers, depositing a sacrificial dielectric layer, removing portions of the sacrificial dielectric layer to expose top surfaces of the source and drain regions, depositing a conductive material over the exposed top surfaces of the source and drain regions, removing remaining portions of the sacrificial dielectric layer to form trenches on opposed ends of the conductive material, depositing a dielectric liner and depositing an oxide within the trenches to form air gap spacers between the gate structure and the source and drain regions.

In accordance with yet another embodiment, a semiconductor structure is provided for reducing parasitic capacitance. The semiconductor structure includes a source region and a drain region disposed within a substrate, spacers disposed in direct contact with sidewalls of a gate structure, a conductive material disposed in direct contact with the top surfaces of the source and drain regions, and a dielectric material disposed on opposed ends of the conductive material such that air gap spacers are created between the gate structure and the source and drain regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
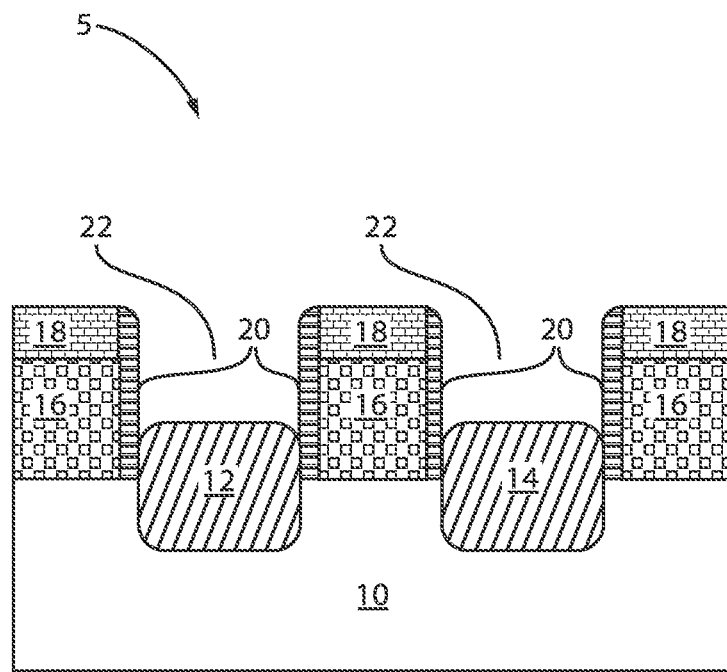
FIG. 1 is a cross-sectional view of a semiconductor structure including source/drain regions formed over a semiconductor substrate, in accordance with an embodiment of the present invention.

Embodiments in accordance with the present invention provide methods and devices for reducing parasitic capacitance between, e.g., gate structures and source/drain regions. In electrical circuits, parasitic capacitance is unwanted capacitance that exists between parts of an electronic component or circuit simply because of their proximity to each other. When two electrical conductors at different voltages are close together, the electric field between them causes electric charge to be stored thereon, which is referred to as parasitic capacitance. Therefore, reducing front end of line (FEOL) parasitic capacitance remains a focus for advanced technology node development. The exemplary embodiments provide for air-gaps that can be created and incorporated into semiconductor manufacturing technology to reduce parasitic capacitance.

Embodiments in accordance with the present invention provide methods and devices for forming air-gap spacers. The air-gap spacers can be formed by employing a sacrificial dielectric layer. The sacrificial dielectric layer can be, e.g., a germanium dioxide ($GeO_2$) sacrificial layer deposited by, e.g., atomic layer deposition (ALD). The subsequent removal of the sacrificial dielectric layer is oxygen-free which helps protect the gate stack. Thus, the sacrificial dielectric layer is used to form or create voids or cavities or air gaps to reduce parasitic capacitance. Moreover, the sacrificial materials are deposited post-gate formation and the air gaps are surrounded or encapsulated by a single material.

Embodiments in accordance with the present invention provide methods and devices for forming an airgap as a spacer for metal oxide semiconductor field effect transistors (MOSFETs) with a simplified oxygen-free sacrificial material removal process. The method includes employing, e.g., $GeO_2$ as the sacrificial spacer layer for air gap spacer formation, skipping poly-open chemical mechanical polish (POC) liner or contact etch stop liner (CESL) deposition to increase the $GeO_2$ layer thickness downstream, forming $GeO_2$ in trench silicide (TS) prior to TS liner deposition, and removing the spacer in the TS trench to further increase the airgap cavity. This has the effect of creating an airgap in between the TS metal and the gate stack for a partial airgap scheme or an airgap from the fin top to the TS top with thin dielectric liner (e.g., SiN) for a full airgap scheme.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including source/drain regions formed over a semiconductor substrate, in accordance with an embodiment of the present invention.

A semiconductor structure 5 includes a fin 10 or substrate over which sacrificial regions or sacrificial layers 16 or sacrificial gate structures 16 are formed. Sacrificial gate cap layers 18 can be formed over the sacrificial gate structures 16. Spacers 20 can be formed adjacent the sacrificial gate structures 16 and the sacrificial gate cap layers 18. Gap regions or trenches 22 can be defined over the source and drain regions 12, 14.

Figure 3:
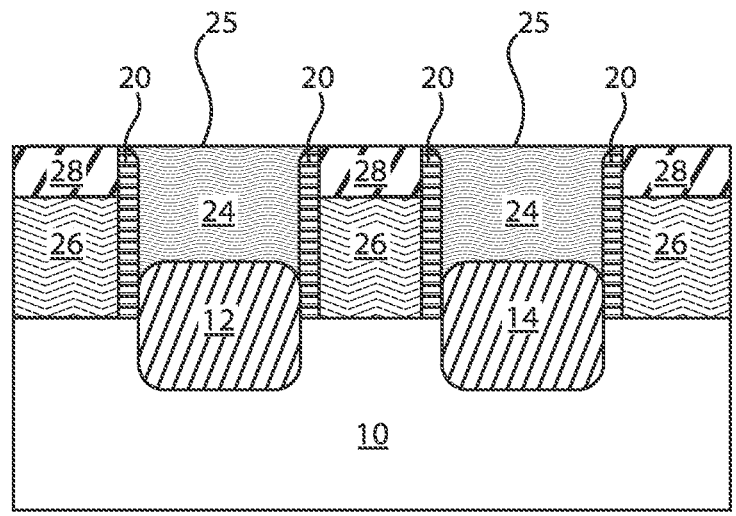
FIG. 3 is a cross-sectional view of the semiconductor structure of FIG. 2 where the sacrificial layers are removed and a replacement metal gate (RMG) module is formed, in accordance with an embodiment of the present invention.

The sacrificial gate structure 16 is a structure that is employed in the process sequence for forming the final device structure, but the sacrificial gate structure 16 is removed prior to finalizing the device structure. In some embodiments, the sacrificial gate structure 16 provides the geometry for a later formed functional gate structure 26 (FIG. 3). The functional gate structure 26, which remains in the structure of the final device controls device switching, i.e., the electrical state of a device, e.g., fin field effect transistor (FinFET), from "ON" to "OFF."

The sacrificial gate structure 16 can be formed from, e.g., amorphous silicon. In another example embodiment, the sacrificial gate structure 16 can include a semiconductor material such as polysilicon or a silicon-containing semiconductor alloy such as a silicon-germanium alloy. The sacrificial gate structure 16 can be formed using chemical vapor deposition (CVD) or plasma enhanced chemical vapor deposition (PECVD). The sacrificial gate structure 16 can have a thickness from about 20 nm to about 300 nm, although lesser and greater thicknesses can also be employed.

Figure 2:
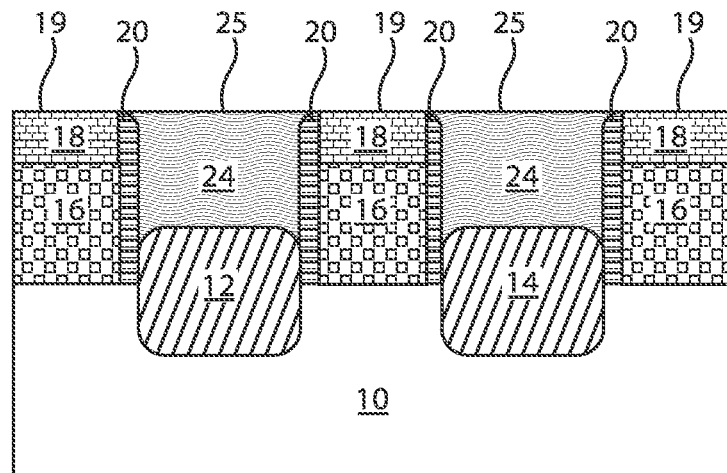
FIG. 2 is a cross-sectional view of the semiconductor structure of FIG. 1 where an inter-layer dielectric (ILD) is formed directly over the source/drain regions, in accordance with an embodiment of the present invention.

The sacrificial gate cap layer 18 can be formed over each of the sacrificial regions 16. The sacrificial gate cap layer 18 has a top surface 19 (FIG. 2). The sacrificial gate cap layer 18 can be manufactured of silicon nitride (SiN), deposited using, for example, low pressure chemical vapor deposition (LPCVD). In other example embodiments, the sacrificial gate cap layer 18 can include, but is not limited to, hafnium oxide ($HfO_2$) or tantalum nitride (TaN) or silicon nitride (SiN). In some embodiments, the sacrificial gate cap layer 18 can include multiple layers, for example, silicon nitride on top of silicon oxide. The sacrificial gate cap layer 18 can be formed utilizing a conventional deposition process including, for example, CVD and PECVD. The sacrificial gate cap layer 18 can have a thickness from about 10 nm to about 200 nm, although lesser and greater thicknesses can also be employed.

Spacers 20 can be formed adjacent the sacrificial regions 16, 18. The spacers 20 can be, e.g., a SiBCN layer. Of course, one skilled in the art can contemplate employing other materials to form the spacers 20.

The etching results in recesses or gaps or openings or trenches 22 formed between the spacers 20. The etching also results in exposing a top surface of the source region 12 and a top surface of the drain region 14. The etching can include a dry etching process such as, for example, reactive ion etching (RIE), plasma etching, ion etching or laser ablation. The etching can further include a wet chemical etching process in which one or more chemical etchants are employed to remove portions of the blanket layers that are not protected by the patterned photoresist. The patterned photoresist can be removed utilizing an ashing process.

In various exemplary embodiments, source/drain regions 12, 14 are formed between the spacers 20. The source/drain regions 12, 14 can extend into the fin 10. The source/drain regions 12, 14 directly contact a portion of the spacers 20. The source/drain regions 12, 14 do not contact the nitride cap 18. The source/drain regions 12, 14 can be epitaxially grown on the fin 10.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

FIG. 2 is a cross-sectional view of the semiconductor structure of FIG. 1 where an inter-layer dielectric (ILD) is formed directly over the source/drain regions, in accordance with an embodiment of the present invention.

In various exemplary embodiments, an oxide gap fill takes place. The ILD oxide 24 can be planarized. The ILD oxide 24 fills the gap or recess or opening between the spacers 20. The ILD oxide 24 extends to a top surface of the sacrificial gate cap layer 18. In other words, a top surface 25 of the ILD oxide 24 can be flush with a top surface 19 of the sacrificial gate cap layer 18.

In various embodiments, the height of the ILD oxide fill 24 can be reduced by chemical-mechanical polishing (CMP) and/or etching. Therefore, the planarization process can be provided by CMP. Other planarization process can include grinding and polishing.

In one or more embodiments, the ILD oxide 24 can have a thickness in the range of about 10 nm to about 100 nm, or in the range of about 10 nm to about 50 nm.

The ILD 24 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 24 include any of the aforementioned materials in porous form, or in a form that changes during processing to or from being porous and/or permeable to being non-porous and/or non-permeable.

FIG. 3 is a cross-sectional view of the semiconductor structure of FIG. 2 where the sacrificial layers are removed and a replacement metal gate (RMG) module is formed, in accordance with an embodiment of the present invention.

In various exemplary embodiments, the sacrificial gate structure 16 is replaced with a functional gate structure 26. The functional gate structure 26 is, e.g., a metal gate or replacement metal gate (RMG). The sacrificial gate cap layer 18 can also be removed with the sacrificial gate structure 16. A self-aligned contact cap 28 can be formed over the functional gate structure 26. The self-aligned contact cap 28 can prevent an electrical short between gate and source/drain contact. The self-aligned contact cap 28 can include any dielectric material including, for example, $SiO_2$, SiN, SiON, SiOCN or SiBCN. The self-aligned contact cap 28 can be formed by a conventional deposition process such as, for example, CVD, PVD or ALD. Portions of the self-aligned contact cap 28 that are located above the topmost surface can be removed by employing a planarization process, such as, for example, CMP or by selective RIE.

Figure 4:
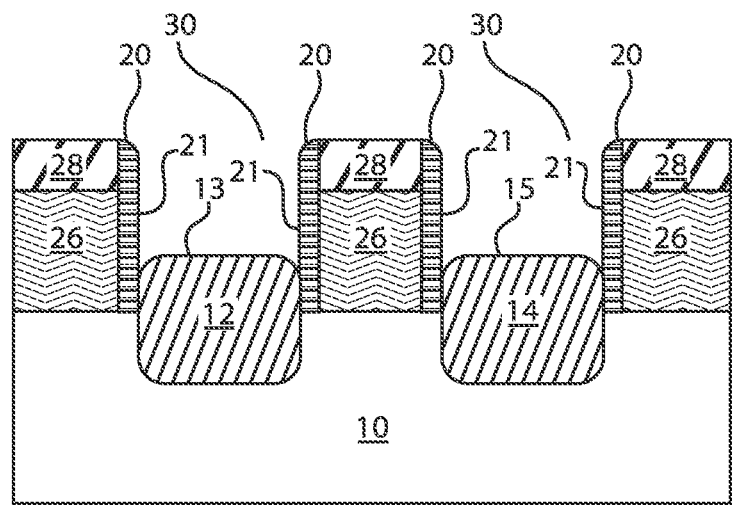
FIG. 4 is a cross-sectional view of the semiconductor structure of FIG. 3 where the ILD is removed to expose a top surface of the source/drain regions, in accordance with an embodiment of the present invention.

FIG. 4 is a cross-sectional view of the semiconductor structure of FIG. 3 where the ILD is removed to expose a top surface of the source/drain regions, in accordance with an embodiment of the present invention.

In various exemplary embodiments, the ILD oxide 24 is removed to expose a top surface 13 of the of the source region 12 and a top surface 15 of the drain region 14. The removal of the ILD oxide 24 also results in the exposure of sidewalls 21 of the spacers 20. Additionally, gaps or openings or trenches 30 are formed between the functional gate structures 26.

Figure 5:
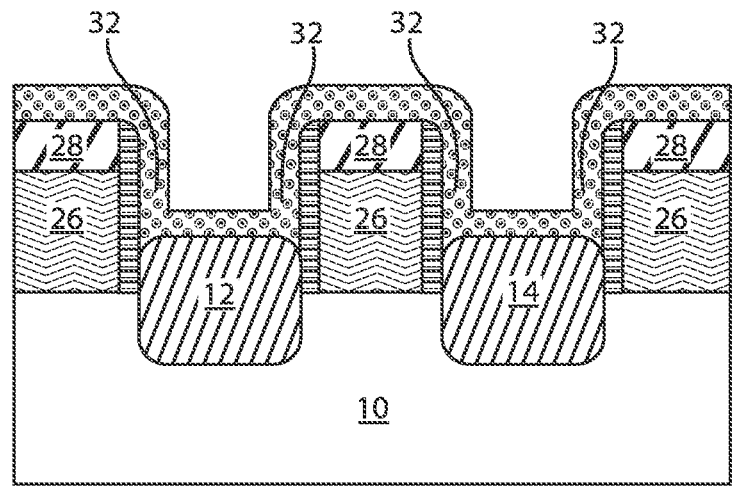
FIG. 5 is a cross-sectional view of the semiconductor structure of FIG. 4 where a sacrificial oxide layer is deposited, in accordance with an embodiment of the present invention.

FIG. 5 is a cross-sectional view of the semiconductor structure of FIG. 4 where a sacrificial oxide layer is deposited, in accordance with an embodiment of the present invention.

In various exemplary embodiments, a sacrificial dielectric layer 32 is deposited. The sacrificial dielectric layer 32 can be, e.g., a germanium dioxide ($GeO_2$) layer 32.

The $GeO_2$ layer 32 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figure 6:
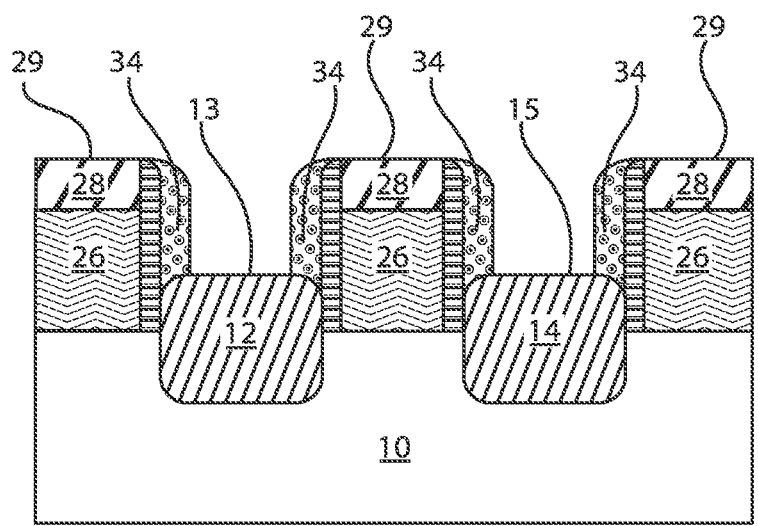
FIG. 6 is a cross-sectional view of the semiconductor structure of FIG. 5 where the sacrificial oxide layer is directionally etched to expose top surfaces of the source/drain regions, in accordance with an embodiment of the present invention.

FIG. 6 is a cross-sectional view of the semiconductor structure of FIG. 5 where the sacrificial oxide layer is directionally etched to expose top surfaces of the source/drain regions, in accordance with an embodiment of the present invention.

In various exemplary embodiments, portions or sections of the $GeO_2$ layer 32 are removed by etching, such as, e.g., RIE. Thus, remaining $GeO_2$ portions 34 are formed adjacent the sidewalls 21 of spacers 20. Additionally, the top surface 13 of the source region 12 and the top surface 15 of the drain region 14 are exposed. It is noted that the remaining $GeO_2$ portions 34 contact the entire sidewall surface of the spacers 20.

Figure 7:
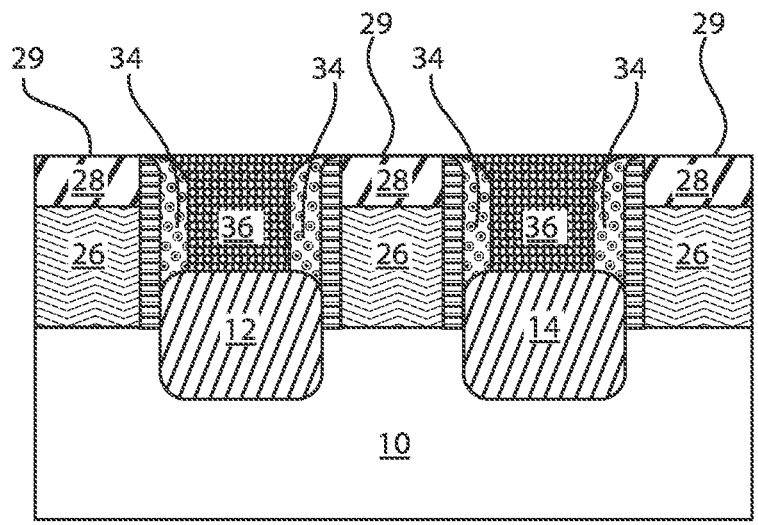
FIG. 7 is a cross-sectional view of the semiconductor structure of FIG. 6 where a metal fill takes place, in accordance with an embodiment of the present invention.

FIG. 7 is a cross-sectional view of the semiconductor structure of FIG. 6 where a metal fill takes place, in accordance with an embodiment of the present invention.

In various exemplary embodiments, a conducting material 36 is deposited over the source and drain regions 12, 14. The conducting material 36 can be referred to as a metal fill. The metal fill 36 can be, e.g., tungsten (W) or cobalt (Co) with silicide metal liner such as titanium (Ti) and titanium nitride (TiN). The metal fill 36 directly contacts the top surface of the source/drain regions 30 and is flush with the top surface 29 of the self-aligned contact cap 28 of the functional gate structures 26.

Figure 8:
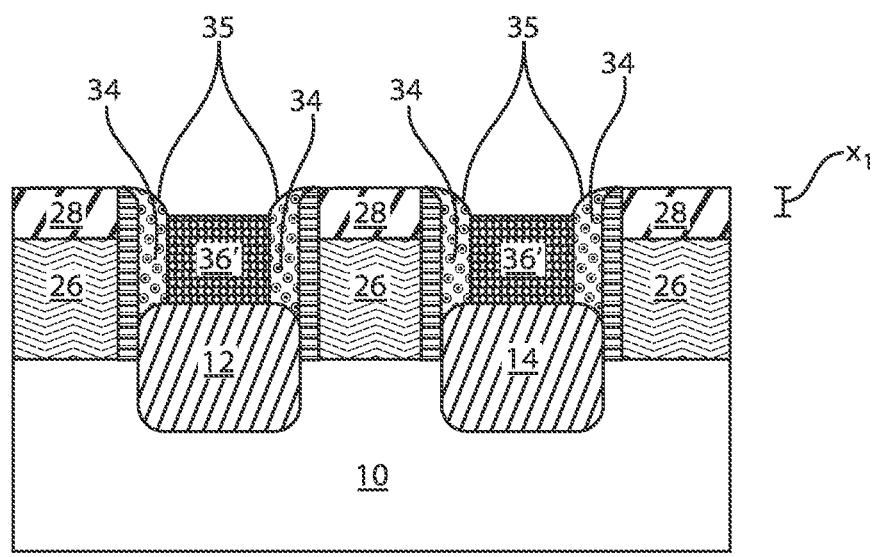
FIG. 8 is a cross-sectional view of the semiconductor structure of FIG. 7 where the metal fill is recessed to expose top surfaces of remaining sacrificial oxide layer portions, in accordance with an embodiment of the present invention.

FIG. 8 is a cross-sectional view of the semiconductor structure of FIG. 7 where the metal fill is recessed to expose top surfaces of remaining sacrificial oxide layer portions, in accordance with an embodiment of the present invention.

In various exemplary embodiments, the metal fill 36 is recessed by a distance "X1" such that top sections 35 of the remaining $GeO_2$ portions 34 are exposed. The remaining metal fill is designated as 36'.

Figure 9:
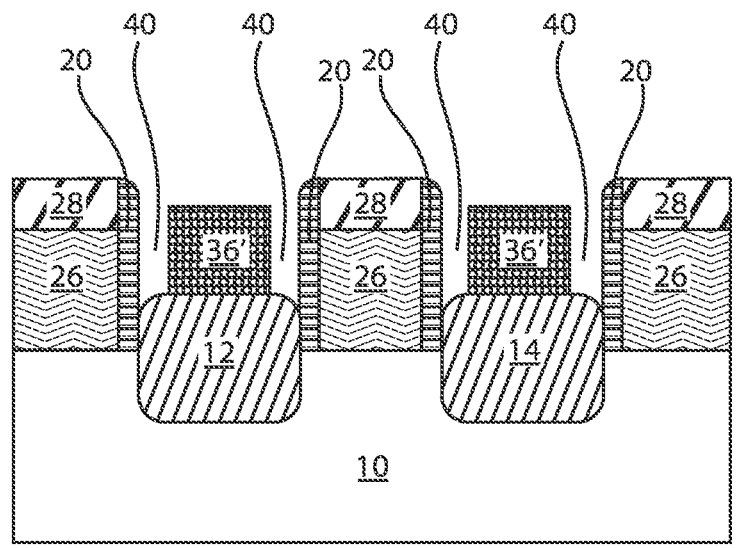
FIG. 9 is a cross-sectional view of the semiconductor structure of FIG. 8 where the remaining sacrificial oxide layer portions are removed, in accordance with an embodiment of the present invention.

FIG. 9 is a cross-sectional view of the semiconductor structure of FIG. 8 where the remaining sacrificial oxide layer portions are removed, in accordance with an embodiment of the present invention.

In various exemplary embodiments, the remaining $GeO_2$ portions 34 are etched away to form opening or trenches 40. The sidewalls 21 of the spacers 20 are now exposed, as are the sidewalls of the remaining metal fill 36'. The etching can occur by, e.g., deionized water (DIW).

Figure 10:
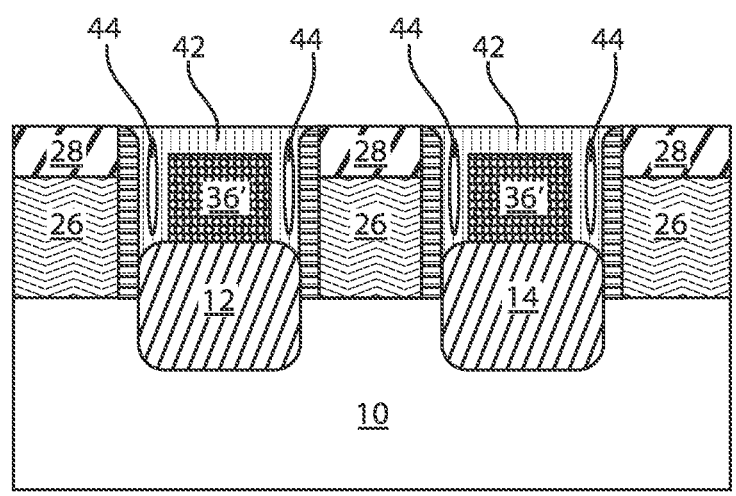
FIG. 10 is a cross-sectional view of the semiconductor structure of FIG. 9 where airgaps are formed between the metal fills, in accordance with an embodiment of the present invention.

FIG. 10 is a cross-sectional view of the semiconductor structure of FIG. 9 where airgaps are formed between the metal fills, in accordance with an embodiment of the present invention.

In various exemplary embodiments, a dielectric 42 can be deposited such that air gaps 44 are formed between the functional gate structures 26. The dielectric 42 can be, e.g., an oxide. The air gaps 44 can be formed between the spacers 20 and the remaining metal fill 36'. Stated differently, the air gaps 44 can be formed on opposed ends of the metal fill 36'. The air-gaps 44 can extend a length of the remaining metal fill 36'. The air-gaps 44 extend toward a top surface of the source/drain regions 12, 14, without contacting the source/drain regions 12, 14. The air gaps 44 can extend between the remaining metal fill 36' and the gate stack 26, 28 (partial airgap scheme). The air-gaps 44 can have a substantially oval-shaped configuration. The air-gaps 44 can have a width of about 2 nm. The formation of the air-gaps 44 also does not cause any damage to the functional gate structures 26. Also, formation of the air-gap spacers 44 reduces the parasitic capacitance between the gate structures 26 and the source/drain regions 12, 14. Thus, the air-gap spacers 44 can be formed in replacement metal gate schemes, which can be incorporated into different types of semiconductor devices, such as, but not limited to, fin field-effect-transistors (FinFETs), gate-all-around devices, and planar FETs.

The air gaps 44 can be formed, e.g., by pinch-off dielectrics deposition and CMP. The pinch-off deposition approach allows for the dielectric 42 to pinch off in a region between the spacers 20 and the remaining metal fill 36'. The pinch-off dielectrics can include, e.g., plasma CVD of SiN, SiCN, SiCOH, carbon doped silicon oxide (pSiCOH), or high density plasma (HDP) $SiN/SiO_2$ in the formation of the air spacers/air gaps 44. Therefore, air-gap formation can be achieved by employing dielectric deposition (by pinch-off of the dielectric layer).

The selection of these dielectric materials and processes has an impact in the voids (gaps 44) dimension and volume. The overall void dimension and type of dielectric material are related to the total device capacitance reduction and reliability. Significant capacitance reduction with good reliability can be achieved on current 7 nm device structures through material, process, and structural/architectural optimization with the pinch-off deposition process approach described herein.

Figure 11:
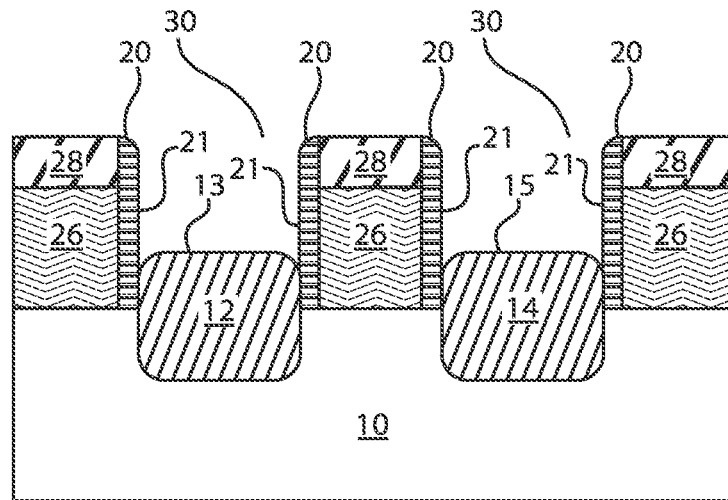
FIG. 11 is a cross-sectional view of the semiconductor structure where source/drain regions are formed over a semiconductor substrate and an RMG module has been formed, in accordance with another embodiment of the present invention.

FIG. 11 is a cross-sectional view of the semiconductor structure where source/drain regions are formed over a semiconductor substrate and an RMG module has been formed, in accordance with another embodiment of the present invention.

In various exemplary embodiments, the sacrificial gate structure 16 is replaced with a functional gate structure 26. The functional gate structure 26 is, e.g., a metal gate or replacement metal gate (RMG). The sacrificial gate cap layer 18 can also be removed with the sacrificial gate structure 16. A self-aligned contact cap 28 can be formed over the functional gate structure 26. A top surface 13 of the source region 12 and a top surface 15 of the drain region 14 are exposed. Additionally, the sidewalls 21 of the spacers 20 are exposed within the trenches 30 formed between the functional gate structures 26.

Figure 12:
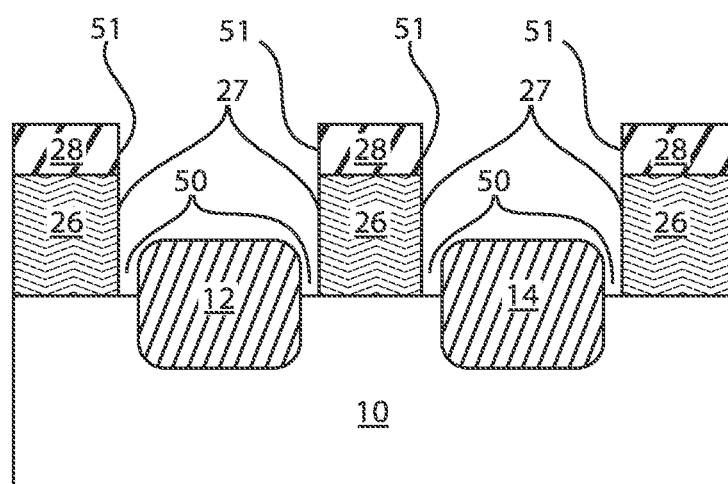
FIG. 12 is a cross-sectional view of the semiconductor structure of FIG. 11 where the spacers adjacent the RMG module are removed, in accordance with an embodiment of the present invention.

FIG. 12 is a cross-sectional view of the semiconductor structure of FIG. 11 where the spacers adjacent the RMG module are removed, in accordance with an embodiment of the present invention.

In various exemplary embodiments, the spacers 20 are removed to expose sidewalls 27 of the functional gate structures 26 and to expose sidewalls 51 of the self-aligned contact cap 28.

Figure 13:
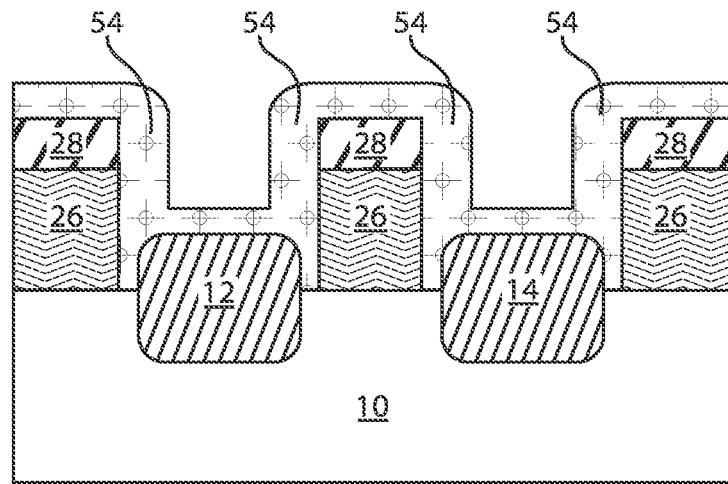
FIG. 13 is a cross-sectional view of the semiconductor structure of FIG. 12 where a sacrificial oxide layer is deposited, in accordance with another embodiment of the present invention.

FIG. 13 is a cross-sectional view of the semiconductor structure of FIG. 12 where a sacrificial oxide layer is deposited, in accordance with another embodiment of the present invention.

In various exemplary embodiments, a sacrificial dielectric layer 54 is deposited. The sacrificial dielectric layer 54 can be, e.g., a germanium dioxide ($GeO_2$) layer 54. The $GeO_2$ layer 54 can be formed by any suitable processing technique, including but not limited to atomic layer deposition (ALD).

Figure 14:
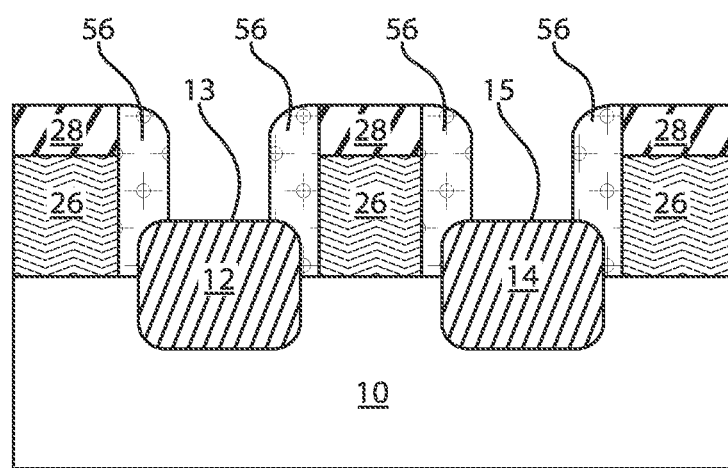
FIG. 14 is a cross-sectional view of the semiconductor structure of FIG. 13 where the sacrificial oxide layer is selectively etched to expose top surfaces of the source/drain regions, in accordance with another embodiment of the present invention.

FIG. 14 is a cross-sectional view of the semiconductor structure of FIG. 13 where the sacrificial oxide layer is selectively etched to expose top surfaces of the source/drain regions, in accordance with another embodiment of the present invention.

In various exemplary embodiments, portions or sections of the $GeO_2$ layer 54 are removed by etching, such as, e.g., RIE. Thus, remaining $GeO_2$ portions 56 are formed adjacent the sidewalls 27 of the functional gate structures 26 and the sidewalls 51 of the self-aligned contact cap 28. Additionally, the top surface 13 of the source region 12 and the top surface 15 of the drain region 14 are exposed.

Figure 15:
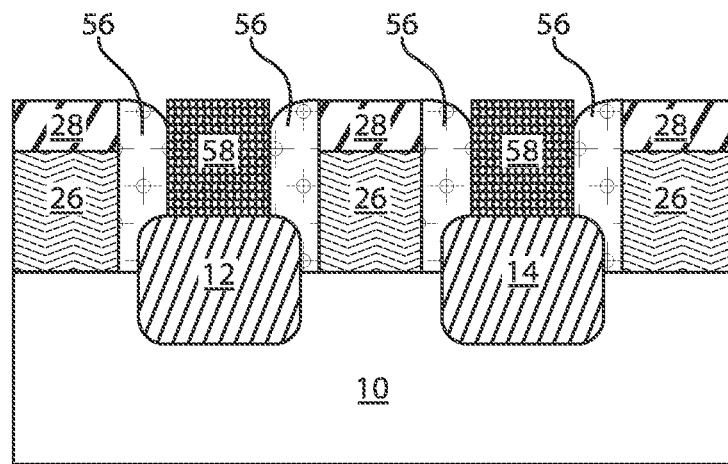
FIG. 15 is a cross-sectional view of the semiconductor structure of FIG. 14 where a metal fill takes place, in accordance with another embodiment of the present invention.

FIG. 15 is a cross-sectional view of the semiconductor structure of FIG. 14 where a metal fill takes place, in accordance with another embodiment of the present invention.

In various exemplary embodiments, a conducting material 58 is deposited over the source and drain regions 12, 14. The conducting material 58 can be referred to as a metal fill. The metal fill 58 can be, e.g., tungsten (W) or cobalt (Co) with silicide metal liner such as titanium (Ti) and titanium nitride (TiN). The metal fill 58 directly contacts the top surface of the source/drain regions 12, 14 and is substantially flush with the top surface 29 of the self-aligned contact cap 28.

Figure 16:
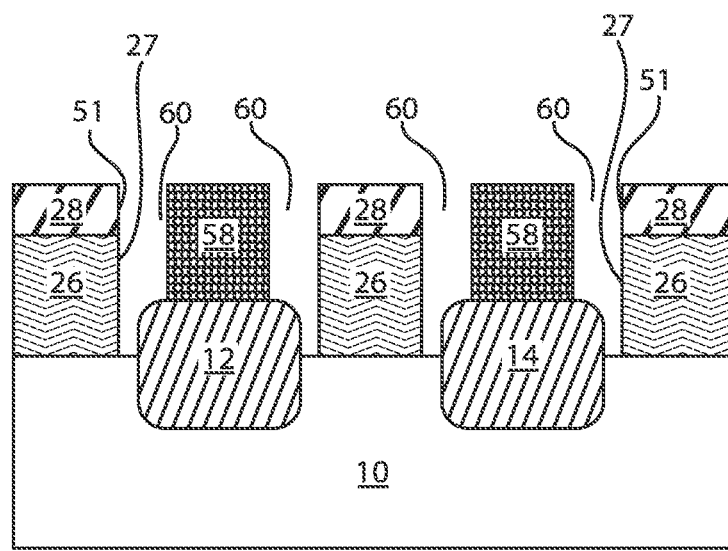
FIG. 16 is a cross-sectional view of the semiconductor structure of FIG. 15 where the remaining sacrificial oxide layer portions are removed, in accordance with another embodiment of the present invention.

FIG. 16 is a cross-sectional view of the semiconductor structure of FIG. 15 where the remaining sacrificial oxide layer portions are removed, in accordance with another embodiment of the present invention.

In various exemplary embodiments, the remaining $GeO_2$ portions 56 are etched away to form opening or trenches 60. The sidewalls 27 of the functional gate structures 26 and the sidewalls 51 of the self-aligned contact cap 28 are now exposed, as are the sidewalls of the metal fill 58. The etching can occur by, e.g., deionized water (DIW).

Figure 17:
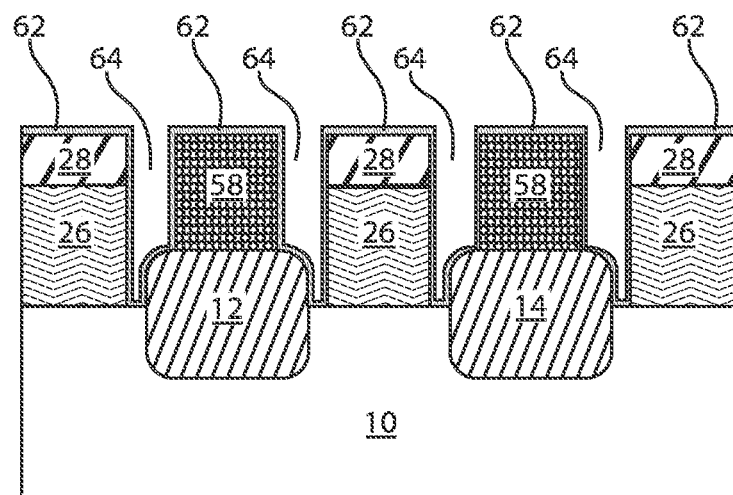
FIG. 17 is a cross-sectional view of the semiconductor structure of FIG. 16 where a nitride liner is deposited, in accordance with another embodiment of the present invention.

FIG. 17 is a cross-sectional view of the semiconductor structure of FIG. 16 where a nitride liner is deposited, in accordance with another embodiment of the present invention.

In an exemplary embodiment, dielectric liner 62 is deposited, thus resulting in trenches 64 between the functional gate structures 26 and the metal fills 58. The dielectric liner 62 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H.

In some embodiments, the dielectric liner 62 includes multiple materials. The dielectric liner 62 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figure 18:
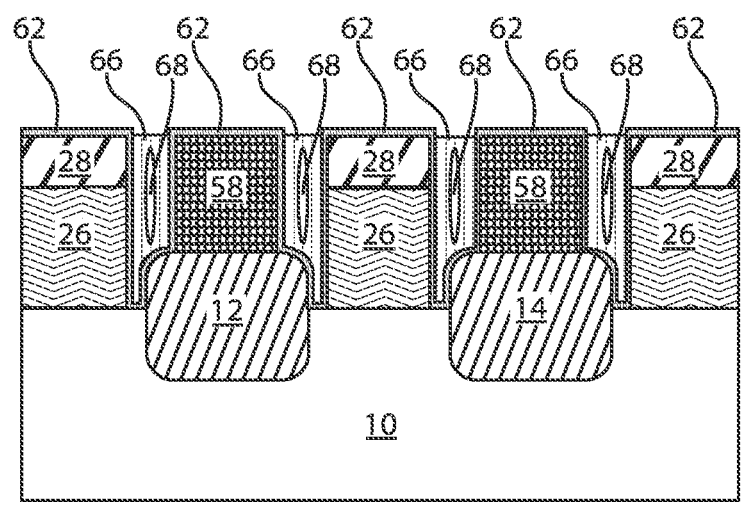
FIG. 18 is a cross-sectional view of the semiconductor structure of FIG. 17 where airgaps are formed between the metal fills, in accordance with an embodiment of the present invention.

FIG. 18 is a cross-sectional view of the semiconductor structure of FIG. 17 where airgaps are formed between the metal fills, in accordance with an embodiment of the present invention.

In various exemplary embodiments, a dielectric 66 can be deposited such that air gaps 68 are formed between the functional gate structures 26. The air gaps 68 can be formed between the functional gate structures 26 and the metal fill 58. Stated differently, the air gaps 68 can be formed on opposed ends of the metal fill 58. The air-gaps 58 can extend a length of the metal fill 58. The air gaps 68 can extend from the top of the fin 10 to the top of the metal fill 58 with a thin dielectric liner 62 encapsulating the air gaps 68 (full airgap scheme). The air-gaps 68 extend toward a top surface of the source/drain regions 12, 14, without contacting the source/drain regions 12, 14. The air gaps 68 can be formed within the confines of the dielectric liner 62. The air-gaps 68 can have a substantially oval-shaped configuration. The air-gaps 68 can have a width of about 2 nm. The formation of the air-gaps 68 also does not cause any damage to the functional gate structures 26. Also, formation of the air-gap spacers 68 reduces the parasitic capacitance between the gate structures 26 and the source/drain regions 12, 14. Thus, the air-gap spacers 68 can be formed in replacement metal gate schemes, which can be incorporated into different types of semiconductor devices, such as, but not limited to, fin field-effect-transistors (FinFETs), gate-all-around devices, and planar FETs.

The air gaps 68 can be formed, e.g., by pinch-off dielectrics deposition and CMP. The pinch-off deposition approach allows for the dielectric 66 to pinch off in a region between the functional gate structures 26 and the metal fill 58. The pinch-off dielectrics can include, e.g., plasma CVD of SiN, SiCN, SiCOH, carbon doped silicon oxide (pSiCOH), or high density plasma (HDP) $SiN/SiO_2$ in the formation of the air spacers/air gaps 68. Therefore, air-gap formation can be achieved by employing dielectric deposition (by pinch-off of the dielectric layer).

In summary, air gap spacer formation can be employed by using a sacrificial dielectric layer, such as a $GeO_2$ layer. POC liner deposition can be skipped in order to increase the thickness of the $GeO_2$ layer and the $GeO_2$ layer can be formed in the TS prior to TS liner deposition. As a result, an oxygen-free sacrificial material removal process can be employed which has a minimal or negligible impact on gate stacks.

In conclusion, continued integrated circuit scaling deeper into the nanoscale regime has provided improved performance through shrinking of the Front-End-of-Line (FEOL) device and Back-End-of-Line (BEOL) interconnect. With scaling, resistance-capacitance (RC) delay is an increasing challenge, limiting overall product performance. Capacitance reduction is therefore important for device performance in both the FEOL and BEOL device structure. Conventional capacitance reduction methods for FEOL and BEOL while maintaining yield and reliability have needed significant material innovations such lower-k cap and bulk dielectrics with desired mechanical, structural, electrical and other properties. To further improve capacitance, other innovations in device structure and process integration are needed, such as air gaps and air spacers described in accordance with the exemplary embodiments of the present invention. The air spacer and air gap structures described herein employ pinch-off deposition to optimize the capacitance reduction while maintaining yield and reliability.

Regarding FIGS. 1-18, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing parasitic capacitance by employing air gap spacers (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing parasitic capacitance, the method comprising:
   forming a source region and a drain region within a substrate;
   forming spacers in direct contact with the source and drain regions, and the substrate;
   depositing an inter-layer dielectric (ILD) over the source and drain regions;
   forming a gate structure adjacent the spacers;
   removing the ILD and the spacers;
   depositing a sacrificial dielectric layer in direct contact with the source and drain regions;
   removing portions of the sacrificial dielectric layer to expose top surfaces of the source and drain regions and to define remaining portions of the sacrificial dielectric layer;
   depositing a conductive material over the exposed top surfaces of the source and drain regions;
   removing the remaining portions of the sacrificial dielectric layer to form trenches on opposed ends of the conductive material;
   depositing a dielectric liner; and
   depositing an oxide within the trenches to form air gap spacers between the gate structure and the conductive material.

2. The method of claim 1, wherein the sacrificial dielectric layer includes germanium dioxide ($GeO_2$).
3. The method of claim 1, wherein each of the air gap spacers extends along a length of the conductive material.
4. The method of claim 1, wherein the air gap spacers extend from a top surface of the substrate to a top surface of the conductive material.
5. The method of claim 1, wherein the air gap spacers are encapsulated by a single material.
6. The method of claim 1, wherein the air gaps spacers are encapsulated by the dielectric liner.
7. The method of claim 1, wherein air gaps in the air gap spacers have a substantially oval-shaped configuration.
8. The method of claim 1, wherein the remaining portions of the sacrificial dielectric layer are removed by employing deionized (DI) water.
9. A method for reducing parasitic capacitance, the method comprising:
   depositing a sacrificial dielectric layer in direct contact with source and drain regions;
   removing portions of the sacrificial dielectric layer to expose top surfaces of the source and drain regions and to define remaining portions of the sacrificial dielectric layer;
   depositing a conductive material over the exposed top surfaces of the source and drain regions;
   removing the remaining portions of the sacrificial dielectric layer to form trenches on opposed ends of the conductive material;
   depositing a dielectric liner; and
   depositing an oxide within the trenches to form air gap spacers between the gate structure and the conductive material.
10. The method of claim 9, wherein the source and drain regions are formed within a substrate.
11. The method of claim 10, wherein spacers are formed in direct contact with the source and drain regions, and the substrate.
12. The method of claim 11, wherein a gate structure is formed adjacent the spacers.
13. The method of claim 12, wherein the spacers are removed before depositing the sacrificial dielectric layer.
14. The method of claim 9, wherein the sacrificial dielectric layer includes germanium dioxide ($GeO_2$).
15. The method of claim 9, wherein each of the air gap spacers extends along a length of the conductive material.
16. The method of claim 9, wherein the air gap spacers extend from a top surface of a substrate to a top surface of the conductive material.
17. The method of claim 9, wherein the air gaps spacers are encapsulated by the dielectric liner.
18. The method of claim 9, wherein air gaps in the air gap spacers have a substantially oval-shaped configuration.
19. The method of claim 9, wherein the remaining portions of the sacrificial dielectric layer are removed by employing deionized (DI) water.
20. The method of claim 9, wherein the dielectric liner includes silicon nitride (SiN).

* * * * *